(12) United States Patent
Yuan et al.

(10) Patent No.: US 7,430,706 B1
(45) Date of Patent: Sep. 30, 2008

(54) DIAGONAL INTERLEAVED PARITY CALCULATOR

(75) Inventors: Shu Yuan, Naperville, IL (US); Thomas A. Peterson, Naperville, IL (US); Kevin E. Sallese, Plainfield, IL (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 99 days.

(21) Appl. No.: 11/676,071

(22) Filed: Feb. 16, 2007

Related U.S. Application Data

(63) Continuation of application No. 10/791,073, filed on Mar. 1, 2004, now Pat. No. 7,191,388.

(51) Int. Cl.
*H03M 13/09* (2006.01)

(52) U.S. Cl. .................................................... 714/807

(58) Field of Classification Search ................. 714/758, 714/775, 781, 798, 807
See application file for complete search history.

(56) References Cited

U.S. PATENT DOCUMENTS

| | | | | |
|---|---|---|---|---|
| 4,205,324 A | * | 5/1980 | Patel | 714/804 |
| 4,435,807 A | * | 3/1984 | Scott et al. | 714/804 |
| 4,486,882 A | * | 12/1984 | Piret et al. | 714/788 |
| 4,796,260 A | * | 1/1989 | Schilling et al. | 714/755 |
| 5,367,544 A | | 11/1994 | Bruekheimer | |
| 5,479,416 A | | 12/1995 | Snodgrass et al. | |
| 5,513,192 A | | 4/1996 | Janku et al. | |
| 5,636,208 A | | 6/1997 | Chang et al. | |
| 5,745,509 A | * | 4/1998 | Marchand | 714/786 |
| 5,751,745 A | | 5/1998 | Chen et al. | |
| 5,771,249 A | | 6/1998 | Yanagisawa | |
| 5,923,653 A | | 7/1999 | Denton | |
| 5,993,056 A | * | 11/1999 | Vaman et al. | 714/776 |
| 6,577,678 B2 | | 6/2003 | Scheuermann | |
| 6,697,994 B2 | | 2/2004 | Ishikawa | |
| 7,058,881 B2 | | 6/2006 | Chu | |
| 2001/0050622 A1 | | 12/2001 | Hewitt et al. | |
| 2002/0178325 A1 | | 11/2002 | Allingham | |

* cited by examiner

*Primary Examiner*—Stephen M Baker

(57) ABSTRACT

A method of calculating a diagonal interleaved parity word for groups of words sampled from a bus is provided, wherein a predetermined number of words are included in each sampling cycle. The bus carries successive data words that are followed by a control word. At each sampling cycle, diagonal XOR calculations chains are propagated through the words that were sampled. However, if a sampling cycle includes the control word, the words following the control word are assigned to logical zero values. The diagonal XOR calculation chains may then be terminated after processing the words in this sampling cycle to derive an intermediate diagonal parity word. The intermediate diagonal parity word may then be adjusted according to the number of words that were assigned logical zero values to calculate a second diagonal interleaved parity word.

14 Claims, 4 Drawing Sheets

DIAGONAL INTERLEAVED PARITY CALCULATOR

RELATED APPLICATION

This application is a continuation of U.S. application Ser. No. 10/791,073, filed Mar. 1, 2004 now U.S. Pat. No. 7,191,388.

TECHNICAL FIELD

The present invention relates to parity calculation, and more particularly to the calculation of a diagonal interleaved parity (DIP) word.

BACKGROUND

Although modern communication protocols enable the transmission of billions of bits per second, conventional backplane switching systems and related components do not have comparable clock rates. For example, the System Packet Interface 4 (SPI4) Phase 2 (SPI4-2) protocol requires a minimum throughput rate of 10 gigabits per second over a SPI4-2 native bus having a width of 16 bits using Double Data Rate (DDR) techniques. At a throughput rate of 10 gigabits, such a bus is thus sampled at a 625 MHz rate. Because of the DDR sampling (sampling at both the rising and falling edge of the clock), the bus is clocked at 312.5 MHz. However, many application specific integrated circuits (ASICs) and field programmable gate arrays (FPGAs) cannot achieve even a 312.5 MHz clocking rate. Thus, external SPI4-2 buses routed to such devices must be demultiplexed according to a slower single edge clock rate that is a fraction of the external 625 MHZ sampling rate for the native SPI4-2 bus. For example, an FPGA having a single edge clock rate that is $1/4^{th}$ the sampling rate of the native SPI4-2 bus receives four 16-bit words (typically denoted as tokens) per FPGA clock cycle. The four tokens are then routed within the FPGA on a four-token wide bus that is clocked at the lower clock rate. In general, the native SPI4-2 bus is demultiplexed according to an FPGA clock that is 1/nth the rate of the bus clock, where n is a positive integer. As just discussed, using a value of n=4 is typical although that may be increased to, for example, a value of n=8 if the FPGA clock rate is relatively slow. At each cycle of the FPGA clock, n words or tokens are demultiplexed from the SPI4-2 native bus.

This demultiplexing of the native SPI4-2 bus causes a number of complications when implementing a SPI4-2 interface using a programmable logic device (PLD) such as an FPGA. For example, the SPI4-2 standard uses a diagonal interleaved parity (DIP) scheme for point-to-point error detection. In a SPI4-2 interface, a SPI4-2 packet such as packet 100 shown in FIG. 1 includes a variable number of sixteen-bit data words 105 that are followed by a single sixteen-bit control word 110. Packet 100 (which may also be denoted as a SPI4-2 burst) thus does not include a control word 115 from a previously-transmitted packet. As illustrated in FIG. 1, packet 100 includes eight data words 105 but it will be appreciated that the number of data words in a given SPI4-2 packet will vary. In other words, a receiver will not know how many data words 105 a given SPI4-2 packet contains until a control word 110 has been detected. Regardless of the number of data words 105 included in a SPI4-2 packet, the packet's end is demarcated by control word 110.

Having received the control word 110 for packet 100, a sixteen bit parity word 120 may be calculated using a diagonal-interleaved parity (DIP) scheme. Each bit of parity word 120 corresponds to a diagonal XOR calculation chain starting at the first data word 105 in packet 100. For example, a diagonal exclusive OR (XOR) calculation chain 121 starts from the most significant bit (bit position 15) of the first data word 105 and propagates through the remaining data words 105 and control word 110 to produce the value for bit position 7 of parity word 120. Calculation chain 121 begins with the XOR of the most significant bit of the first data word 105 and the next-most-significant bit (bit position 14) of the second data word 105. As can be seen from FIG. 1, bit position 15 of the first data word 105 holds a logical one whereas bit position 14 of the second data word 105 holds a logical zero. The XOR product is thus a logical 1. This XOR product propagates through calculation chain 121 by being XORed with the bit stored in bit position 13 of the third data word 105, the resulting XOR product then XORed with the bit stored in bit position 12 of the fourth data word 105, and so on, until the final XOR product is XORed with the bit stored in bit position 7 of control word 110 to produce a value for bit position 7 of parity word 120. It may be seen that the XOR product of the resulting bit sequence {1,0,0,1,0,0,0,0,1} in calculation chain 121 produces a value of logical one for bit position 7 of parity word 120.

The remaining diagonal XOR calculation chains are processed analogously. For example, diagonal XOR calculation chain 122 starts at bit position 14 of the first data word 105 and propagates through the remaining data words 105 and control word 110. In chain 122, the starting bit is XORed with the bit stored in bit position 13 of the second data word 105. The resulting XOR product is XORed with the bit stored in bit position 12 of the third data word 105, and so on, until the value for bit position 6 of parity word 120 is produced. Note that the least four significant bits of control word 110 are replaced with logical ones during the calculation of the least four significant bits for parity word 120.

There will always be diagonal XOR calculation chains that must wrap around in a circular modulo-16-bit fashion. For example, diagonal XOR calculation chain 123 starts at bit position 2 of the first data word 105 before propagating through the remaining data words 105 and control word 110. By the third data word 105, chain 123 is at the least significant bit (bit position 0). Thus chain 123 must wrap around to the most significant bit (bit position 15) as it propagates through the fourth data word 105.

After sixteen-bit parity word 120 has been calculated, its most significant byte is XORed with the least significant byte to produce 8-bit parity word 130. In turn, parity word 130 is folded and the two halves XORed to produce a DIP4 parity word 135. In this fashion, sixteen-bit parity word 120 is collapsed to produce DIP4 parity word 135. In a receive function, DIP4 parity word 135 is compared to the original value stored in the least four significant bits of control word 110 (which had been treated as being all logical ones for the DIP calculation) to determine if the data words 105 and control word 110 were received correctly. Conversely, in a transmit function, DIP4 parity word 135 would replace these four bits in control word 110.

The calculation of DIP4 parity word 135 becomes problematic when performed by a programmable logic device such as an FPGA as a result of the demultiplexing of the native SPI4-2 bus. Because of the demultiplexing, the position of the control word cannot be readily determined, requiring in prior approaches that a number of sets of calculation chains be calculated. As discussed previously, to implement a SPI4-2 interface in an FPGA, there will be n 16-bit words from packet 100 received for every FPGA clock cycle. Should the received packet contain more than n words, the XOR calculation chains cannot be finished in just one FPGA clock cycle. For example, assume that n equals four as discussed previously and that the packet corresponds to packet 100 of FIG. 1. At each FPGA clock cycle, four words from packet 100 will be received into a register 200 as shown in FIG. 2. The four words stored within register 200 may be designated word 3 through word 0 according to their sequence within packet 100. For example, if this FPGA clock cycle is such that the beginning of packet 100 is captured, then word 3 corresponds to the first data word 105, word 2 corresponds to the second data word 105, word 1 corresponds to the third data word 105, and word 0 corresponds to the fourth data word 105. Given just these four words, it is clear that the diagonal XOR calculation chains such as chains 121, 122, and 123 of FIG. 1 cannot be completed during this FPGA clock cycle.

Instead, diagonal XOR calculation chains 210 will be propagated through words 3, 2, 1, and 0 and the results stored such as in an inter-slice parity summing register 205. For example, a diagonal XOR calculation chain 210*a* begins at the most significant bit of word 3 and continues through bit position 14 of word 2 and bit position 13 of word 1 to include bit position 12 of word 0. This resulting value is then stored in bit position 12 of an inter-slice parity summing register 205. Similarly, another diagonal XOR calculation chain 210*b* begins at bit position 14 of word 3 and continues through bit positions 13 of word 2 and bit position 12 of word 1 to include bit position 11 of word 0. This resulting value is then stored in bit position 11 of inter-slice parity summing register 205. At the next FPGA clock cycle, the values stored in inter-slice parity summing register 205 will load into the diagonal XOR calculation chains 210. But note that it will not be known where control word 110 will be placed within register 200. For example, with respect to packet 100, register 200 would contain the first four data words 105 in the initial FPGA clock cycle. At the second FPGA clock cycle, register 200 would contain the next four data words. Finally, at the third FPGA clock cycle register 200 would store control word 110. Because there were eight data words 105 preceding control word 110 in packet 100, control word 110 would be received as word 3 in register 200. However, if register 200 was processing a packet having nine data words 105, then control word 110 would be received as word 2 in register 200. It thus follows that control word 110 may be received as any one of words 3 through word 0 in register 200, depending upon the size of the packet being processed.

Because it cannot be predicted where control word 110 will end up in register 200, it cannot be predicted where a diagonal XOR calculation chain will end when register 200 contains control word 110. For example, diagonal XOR calculation chain 210*a* could end at any one of four extraction points 220*a*, 220*b*, 220*c*, and 220*d*, depending upon where control word 110 was received. If control word 110 is received as word 3, diagonal XOR calculation chain 210 would end at extraction point 220*a*. Alternatively, if control word 110 is received as word 2, diagonal XOR calculation chain 210*a* would end at extraction point 220*b*. As yet another alternative, if control word 110 is received as word 1, diagonal XOR calculation chain 210*a* would end at extraction point 220*c*. Finally, if control word 110 is received as word 0, diagonal XOR calculation chain 210*a* would end at extraction point 220*d*. In this fashion, the number of XOR calculation chains 210 is increased by n times because each extraction point must be considered. For example, with respect to a value of n=4 such as used in register 200, there would thus be four sets of diagonal XOR calculation chains, each set having 16 chains corresponding to the sixteen bits for each word in packet 100. This is very inefficient because only one set will provide the DIP4 parity word 135 as determined by which position control word 110 ends up in register 200. The 16-bit value from this particular set of diagonal XOR calculation chains forms parity word 120, which is then collapsed to form DIP4 parity word 135 as discussed with respect to FIG. 1. However, the 16-bit values from the remaining diagonal XOR calculation chain sets would be of no use with respect to forming DIP4 parity word 135. This inefficiency is worsened as the value of n increases.

Accordingly, there is a need in the art for improved DIP parity word calculation techniques.

SUMMARY

One aspect of the invention relates to a programmable device configured to calculate a diagonal interleaved parity word for a packet formed from a sequence of data words and ending in a control word, the programmable device comprising: a plurality of programmable blocks, one or more of the programmable blocks being configured to propagate a set of diagonal XOR calculation chains through the packet to provide the diagonal interleaved parity word, the one or more programmable blocks being configured such that the diagonal XOR calculation chains have the same length regardless of the number of data words in the packet.

Another aspect of the invention relates to a method of calculating a diagonal interleaved parity (DIP) word from a packet formed from a succession of data words ordered from a first data word to a last data word, the packet ending in a control word. The method includes the acts of successively sampling a predetermined number of ordered words from a bus, wherein the first sample starts at the first data word; for each successive sample of words, determining whether the control word is included in the sample: if the control word is not included in the sample, propagating a set of diagonal XOR calculation chains through the sample; if the control word is included in the sample, assigning the words following the control word in the sample to logical zeroes and then propagating the set of diagonal XOR calculation chains through the sample to provide a DIP parity word.

In accordance with another aspect of the invention, a programmable device is provided that is configured to calculate a diagonal interleaved parity (DIP) word from a packet formed from a sequence of data words arranged from a first data word through a last data word, the packet ending in a control word. The programmable device includes: a plurality of programmable blocks, one or more of the programmable blocks being configured to sequentially process the packet by sampling an external bus an ordered sample of words at a time to form a first ordered sample through a last ordered sample, the first ordered sample beginning with the first data word, the last ordered sample containing the control word, wherein any words following the control word in the last ordered sample are assigned to logical zeroes, the one or more programmable blocks being configured to sequentially process the ordered samples by propagating a set of diagonal XOR calculation chains through each ordered sample to produce an intermediate DIP word and then adjusting the intermediate DIP word according to the number of words assigned to logical zeroes in the last ordered sample to produce a second DIP parity word.

DETAILED DESCRIPTION

Figure 1:
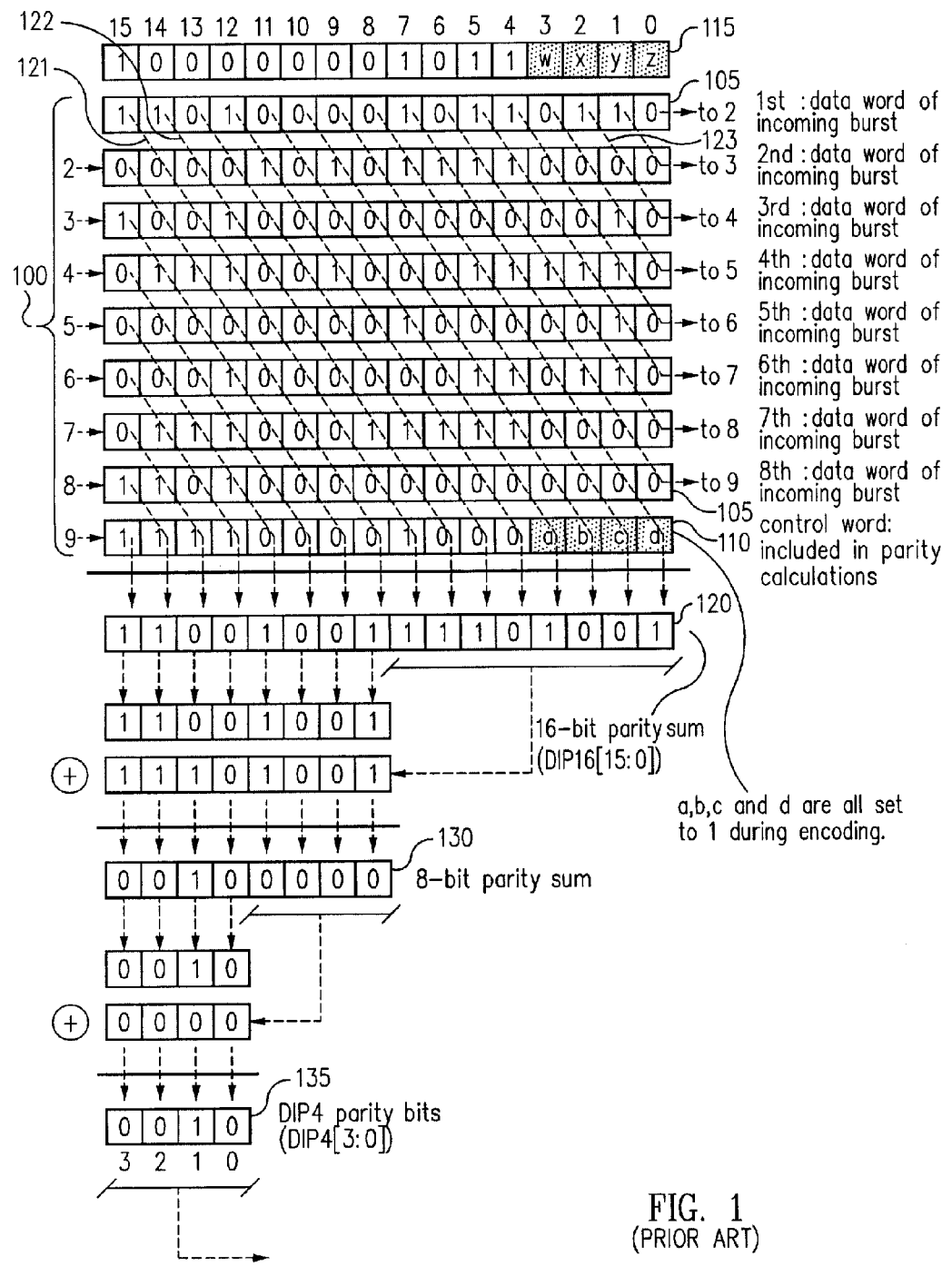
FIG. 1 illustrates the XOR calculation chains necessary to calculate a DIP4 parity word for a SPI4-2 packet comprised of eight data words and one control word.

The diagonal interleaved parity (DIP) calculation techniques disclosed herein will be described with respect to a SPI4-2 implementation, wherein each packet is comprised of sixteen-bit words such as those discussed with respect to packet 100 of FIG. 1. However, it will be appreciated that the calculation techniques disclosed herein are widely applicable to any arbitrary word width. Moreover, the DIP calculation need not be performed with respect to the SPI4-2 standard, any standard needing a DIP parity word calculation would benefit from the techniques discussed herein.

Figure 2:
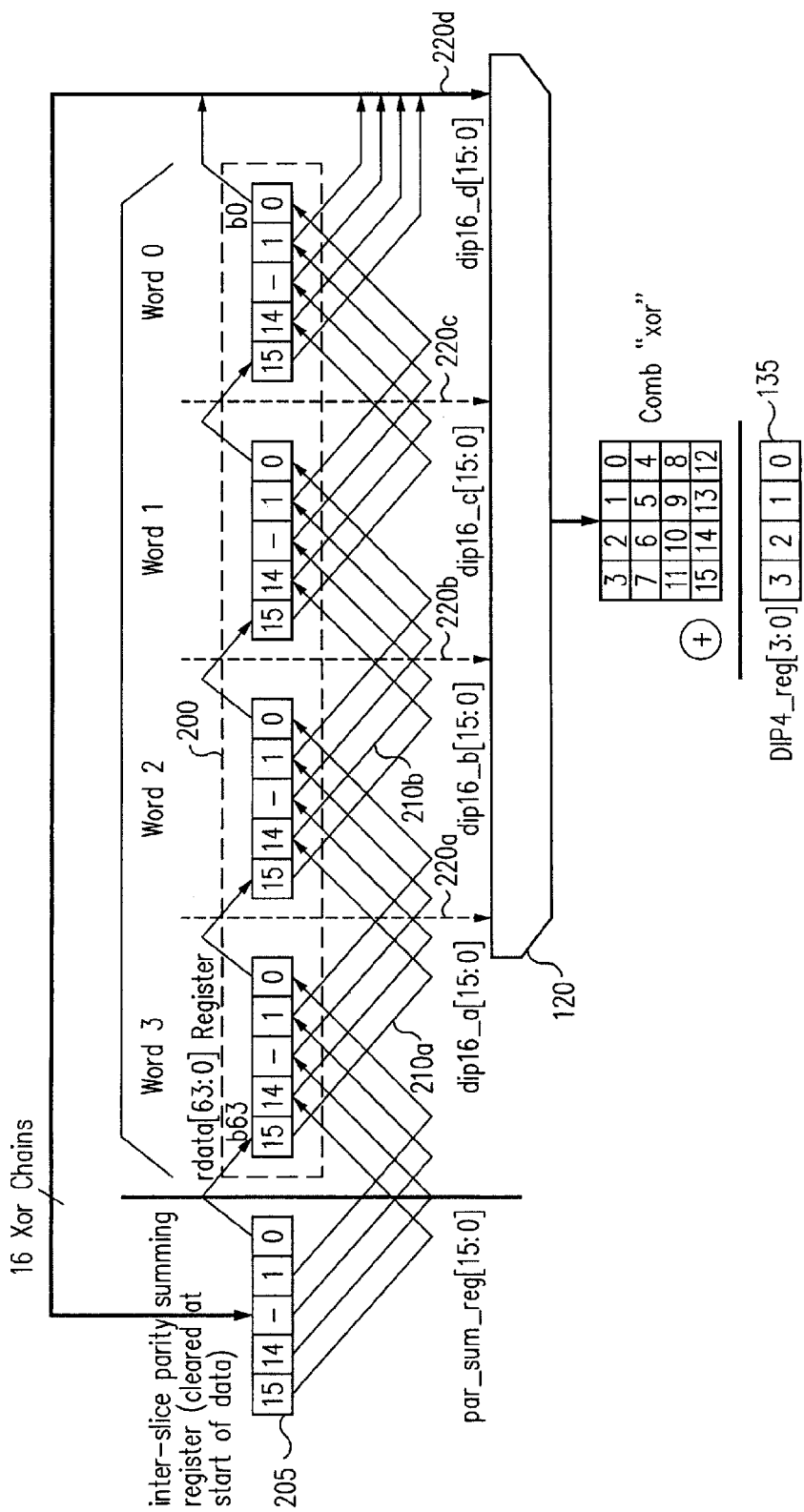
FIG. 2 illustrates the implementation of a DIP4 parity word calculation in a programmable logic device that demultiplexes four words from a SPI4-2 packet at each programmable logic device clock cycle.

As discussed with respect to FIG. 2, any system implementing a SPI4-2 standard that cannot process the tokens within a SPI4-2 packet at the rate of the native SPI4-2 bus will need to demultiplex the bus at a clock rate that is 1/nth the rate of bus' clock rate, where n is a positive integer. A typical value for n is four but eight may also be necessary if the bus clock rate is too high with respect to the system's clock rate. In the following discussion, the system will be assumed to be a field programmable gate array (FPGA) but it will be appreciated that the DIP parity word calculation disclosed is widely applicable to any system that must demultiplex the native SPI4-2 bus during the calculation of the DIP parity word.

At each FPGA clock cycle, n sixteen-bit SPI4-2 words (typically denoted as "tokens") are demultiplexed from the native SPI4-2 bus. To avoid the inefficiencies discussed with respect to prior art DIP parity word calculation schemes, only one set of sixteen diagonal XOR calculation chains (one for each bit in the sixteen-bit words) need be used to generate DIP4 parity word 135 shown in FIG. 1. Thus, regardless of the value of n, the number of diagonal XOR calculation chains remains the same. This is very efficient when compared to prior art schemes that require n sets of diagonal XOR calculation chains, each set comprised of sixteen diagonal XOR calculation chains.

To enable the use of just one set of diagonal XOR calculation chains, the present invention exploits the following property of the XOR function: a diagonal XOR calculation chain will not have its value changed by propagating through additional bits, so long as those additional bits are all logical zeroes. In other words, if a diagonal XOR calculation chain has a value of logical zero and is XORed with another logical zero, the result is still logical zero. Similarly, if a diagonal XOR calculation chain has a value of logical one and is XORed with another logical zero, the result is still logical one. In formal terms, logical zero is the identity element for an XOR operation.

This property of logical zero with respect to the XOR operation may be exploited as follows. During each FPGA clock cycle, the n words received from the demultiplexing of the native SPI4-2 bus are examined. As discussed with respect to FIG. 2 for register 200, these n words have an inherent order with respect to how they were carried on the native SPI4-2 bus. In other words, to acquire the set of n words for each demultiplex cycle (or equivalently, each FPGA clock cycle) first one word is received from the native SPI4-2 bus, then another, and so on, until all n words are received. For example, word 3 is the first word received with respect to register 200 of FIG. 2, word 2 is the second word received, word 1 is the third word received, and word 0 is the last word received. This order should be maintained for each set of n words so that the XOR calculation chains may be formed properly. But recall that it cannot be predicted ahead of time what position control word 110 will have in this order. Instead, control word 110 may arrive as any one of the n words. Any words arriving after control word 110 have no bearing on the calculation of DIP4 parity word 135. Thus, the identity property of logical zero with respect to an XOR calculation may be exploited by assigning all words that arrive after control word 110 to comprise all logical zeroes.

For example, assume with respect to register 200 that control word 110 is received as word 1. The bits within word 0 would then be assigned to be all logical zeroes to complete the values within register 200. However, diagonal XOR calculation chains 210 continue through word 0 as described previously. Consider diagonal XOR calculation chain 210a. Because only one set of diagonal XOR calculation chains will be used, diagonal XOR calculation chain 210a need not be complicated with the possible extraction points 220a, 220b, and 220c discussed with respect to prior art applications. Instead, diagonal XOR calculation chain 210a would have just a single extraction point 220d.

The same extraction point 220d would be used for the remaining diagonal XOR calculation chains 210. Because it is assumed in this example that control word 110 is received as word 1 in register 200, the prior art extraction point 220c provides the correct value for sixteen-bit parity word 120. If the correct value for sixteen-bit parity word 120 is assumed to be [1100100111101001] as shown in FIG. 2, these values are shifted to the right in a circular modulo-16-bit fashion by 1a continuing to propagate the diagonal XOR calculation chains through word 0 before extraction at point 220d. This would produce a value for sixteen-bit parity word 120 as [1110010011110100]. Thus, sixteen-bit parity word 120 must then be shifted back to the left in a circular modulo-16-bit fashion to recover the correct value. Parity word 120 may then be collapsed to produce DIP4 parity word 135 as discussed previously.

Figure 3:
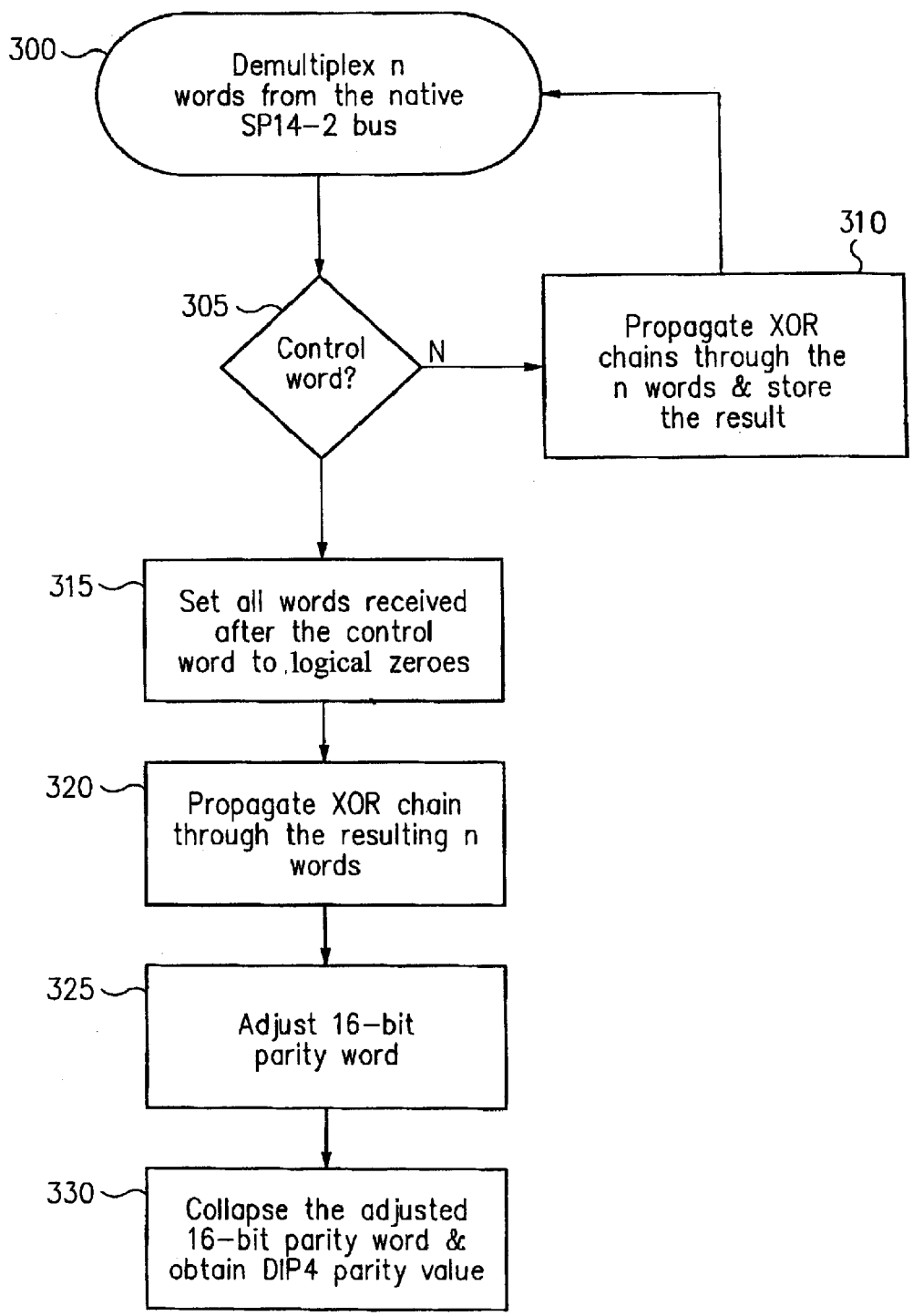
FIG. 3 is a flowchart for a DIP parity word calculation scheme according to one embodiment of the invention.

The resulting DIP calculation technique may be summarized with respect to FIG. 3. At step 300, n words are demultiplexed from the native SPI4-2 bus. For example, with respect to register 200, words 3 through 0 are received. Then, at step 305, the n words are examined to see if control word 110 has been received. If control word has not been received, the diagonal XOR calculation chains may be propagated through the n words in a conventional fashion and the result stored such as in inter-slice summing register 205 at step 310. If, however, the control word 110 was received, then words received after control word 110 in the set of n words are set to all logical zeroes at step 315. The diagonal XOR chains may then be propagated through the resulting n words to produce a value for an intermediate 16-bit parity word 120 at step 320. At step 325, 16-bit parity word 120 is shifted to the left one bit for each word that was set to all logical zeroes in step 315. After this adjustment, 16-bit parity word 120 may be collapsed into a second DIP parity word such as DIP4 parity word 135 in step 330.

Although the just-described technique is very efficient with respect to having just a single extraction point for the diagonal XOR calculation chains, additional improvements may be carried out. For example, if n equals eight, 16-bit parity word 120 may have to be shifted up to 7 bit positions. Three bits are required to code for this value. But note that 16-bit parity word 120 will be collapsed into four-bit DIP4 parity word 135. Thus, these potential shifts of up to 7 bit positions will be folded into one of three possible values. For example, if 16-bit parity word 120 must be shifted to the left by one bit position, this operation is equivalent to shifting DIP4 parity word 135 to the left by one position also. Similarly, if 16-bit parity word 120 must be shifted to the left by either 2 or 3 bit positions, such operations are equivalent to shifting DIP4 parity word 135 to the left by 2 or 3 bit positions, respectively. If 16-bit parity word 120 must be shifted by four bit positions, such an operation is equivalent to shifting DIP4 parity word 135 by no bit positions. However, if 16-bit parity word 120 must be shifted by five bit positions, such an operation is equivalent to shifting DIP4 parity word 135 by one bit position. Thus, it may be summarized that the number of bit positions that 16-bit parity word 120 must be shifted by may be converted to a 2-bit value in a circular modulo-2-bit fashion. Then, rather than shift 16-bit parity word 120, DIP4 parity word 135 is shifted by the converted bit value. In this fashion, the adjustment of from 1 to seven bits is converted by 12 to just one to 3 bits, making the required logic simpler to implement.

As described so far, the DIP4 parity word 135 calculation techniques may be used for either a transmit or a receive operation. In a transmit operation, DIP4 parity word 135 is calculated and then inserted into the least four significant bit positions of control word 110. The seed values of all logical ones in these bit positions are thus replaced by DIP4 parity word 135. In a receive operation, DIP4 parity word 135 would be compared to the original values of those bit positions in control word 110 to determine if the SPI4 packet had been received correctly.

Figure 4:
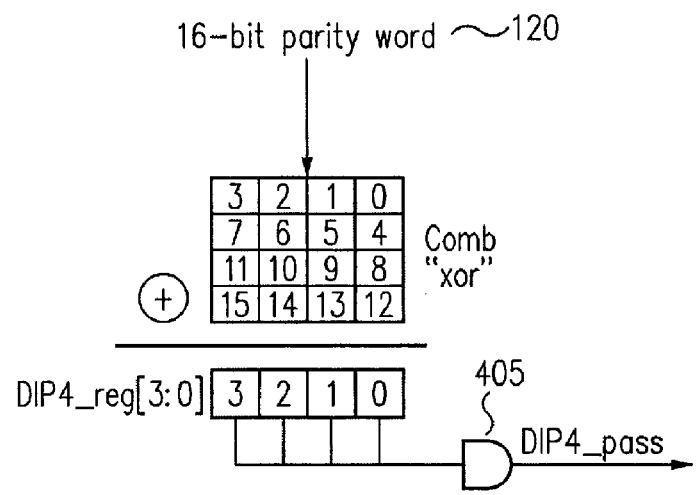
FIG. 4 illustrates a 4-input AND implementation for checking a DIP parity word according to one embodiment of the invention.

The receive operation may be modified further for additional simplification. For example, rather than replace the last four bits of control words with logical ones as discussed with respect to FIG. 1, the received values may be used instead. In such a case, DIP4 parity word 135 will simply equal the seed values of all logical ones if the SPI4-2 packet has been received correctly. The check of DIP4 parity word 135 may then be minimized to the use of a 4-input AND gate 405 as seen in FIG. 4 rather than a comparison between a calculated and a received value. If AND gate 405 outputs a logical one, the received packet was correct. Otherwise, if AND gate 405 outputs a logical zero, the received packet contained one or more errors.

Figure 5:
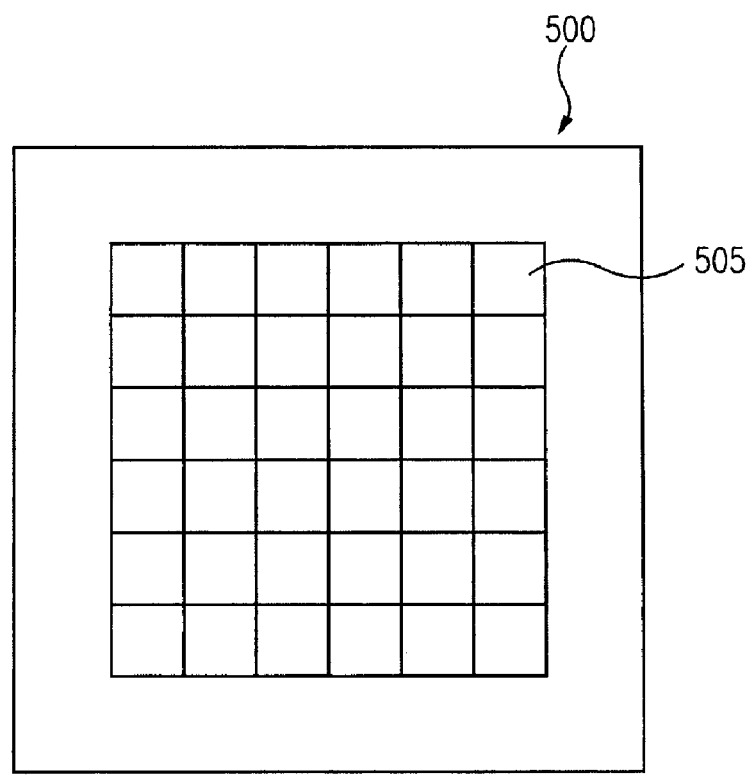
FIG. 5 is a block diagram of an FPGA that may be configured to implement the DIP parity word calculation scheme of FIG. 3. Use of the same reference symbols in different figures indicates similar or identical items.

To implement the above-described technique, an FPGA need only be configured correctly and have the appropriate registers. For example, an FPGA 500 shown in FIG. 5 contains a plurality of logic blocks 505. Suppose FPGA 500 is being used for a demultiplex rate of n=4 as described with respect to FIG. 2. Inter-slice summing register 205 and register 200 are not shown in FPGA 500 for ease of illustration. Logic blocks 505 would be configured with the appropriate logic to carry out the required intermediate XOR calculation chains 210. For example, with respect to the implementation of two of diagonal XOR calculation chains 210, logic blocks 505 may be configured according to the following RTL statement:

par_sum_reg[0]=par_sum_reg[4]^rdata[0]^rdata[17]^rdata[34]^rdata[51] par_sum_reg[15]=par_sum_reg[3]^rdata[15]^rdata[16]^rdata[33]^rdata[50] where par_sum_reg[n] represents the nth bit stored in inter-slice summing register 205, rdata[n] represents the nth bit stored in register 200, and ^ represents an XOR operation.

The above-described embodiments of the present invention are merely meant to be illustrative and not limiting. For example, although described as being implemented in an FPGA, it will be appreciated that the DIP parity calculation techniques disclosed herein are equally applicable to an ASIC implementation of SPI4-2 interface. It will thus be obvious to those skilled in the art that various changes and modifications may be made without departing from this invention in its broader aspects. Accordingly, the appended claims encompass all such changes and modifications as fall within the true spirit and scope of this invention.

What is claimed is:

1. A programmable device configured to calculate a diagonal interleaved parity word for a packet formed from a sequence of data words and ending in a control word, the programmable device comprising:
a plurality of programmable blocks, one or more of the programmable blocks being configured to propagate a set of diagonal XOR calculation chains through the packet to provide the diagonal interleaved parity word, the one or more programmable blocks being configured such that the diagonal XOR calculation chains have the same length regardless of the number of data words in the packet.

2. The programmable device of claim 1, wherein each programmable block is a look-up-table-based programmable block.

3. The programmable device of claim 1, wherein each programmable block is an AND-array-based programmable block.

4. The programmable device of claim 1, wherein the data words and the control words correspond to sequential samples of an external bus supporting a wire-line-level protocol.

5. The programmable device of claim 4, wherein the wire-line-level protocol is SPI4-2.

6. The programmable device of claim 4, wherein each data word and the control word of the external bus is sixteen-bits wide.

7. The programmable device of claim 4, wherein each sequential sample provides four words from a set consisting of the data words and the control word.

8. A method of calculating a diagonal interleaved parity (DIP) word from a packet formed from a succession of data words ordered from a first data word to a last data word, the packet ending in a control word, the method comprising:
successively sampling a predetermined number of words from the packet, wherein the first sample starts at the first data word;
for each successive sample of words, determining whether the control word is included in the sample:
if the control word is not included in the sample of words, propagating a set of diagonal XOR calculation chains through the sample; and
if the control word is included in the sample of words, assigning the words following the control word in the sample to logical zeroes and then propagating the set of diagonal XOR calculation chains through the sample of words to provide a DIP parity word.

9. The method of claim 8, wherein the provided DIP parity word is an intermediate DIP parity word, the method further comprising adjusting the intermediate DIP parity word to provide a second DIP parity word.

10. The method of claim 9, wherein the adjustment of the intermediate DIP parity word to provide the second DIP parity word comprises shifting the bits of the intermediate DIP parity word to the left one bit for each word that was assigned values of logical zeroes.

11. A programmable device configured to calculate a diagonal interleaved parity (DIP) word from a packet formed from a sequence of data words arranged from a first data word through a last data word, the packet ending in a control word, the programmable device comprising:

a plurality of programmable blocks, one or more of the programmable blocks being configured to sequentially process the packet by sampling an external bus an ordered sample of words at a time to form a first ordered sample through a last ordered sample, the first ordered sample beginning with the first data word, the last ordered sample containing the control word, wherein any words following the control word in the last ordered sample are assigned to logical zeroes, the one or more programmable blocks being configured to sequentially process the ordered samples by propagating a set of diagonal XOR calculation chains through each ordered sample to produce an intermediate DIP word and then adjusting the intermediate DIP word to produce a second DIP parity word.

12. The programmable device of claim 11, wherein each ordered sample of words comprises four ordered words.

13. The programmable device of claim 11, wherein the external bus is a SPI4-2 bus.

14. The programmable device of claim 13, wherein each data word and the control word of the SPI4-2 bus is sixteen-bits wide.

* * * * *